US008972815B1

(12) United States Patent
Hwee et al.

(10) Patent No.: US 8,972,815 B1
(45) Date of Patent: Mar. 3, 2015

(54) RECOVERY OF MEDIA DATAGRAMS

(75) Inventors: Poh Meng Hwee, Singapore (SG); Sun Yuxi, Singapore (SG)

(73) Assignee: Xilinx, Inc., San Jose, CA (US)

( * ) Notice: Subject to any disclaimer, the term of this patent is extended or adjusted under 35 U.S.C. 154(b) by 245 days.

(21) Appl. No.: 13/425,363

(22) Filed: Mar. 20, 2012

(51) Int. Cl.
*H03M 13/00* (2006.01)
*H03M 13/11* (2006.01)
*H04L 1/00* (2006.01)
*G06F 17/30* (2006.01)

(52) U.S. Cl.
CPC ............ *H03M 13/11* (2013.01); *H03M 13/116* (2013.01); *H04L 1/0057* (2013.01); *H04L 1/0041* (2013.01); *G06F 17/30324* (2013.01)
USPC ............................. 714/752; 714/746; 714/786

(58) Field of Classification Search
CPC ................ H04L 1/0057; H04L 1/0041; H04L 25/03057; H04L 1/0059; H04L 1/1614; H03M 13/116; H03M 13/23; H03M 13/2957; H03M 13/11; H03M 13/27; G06F 17/30513; G06F 17/30324
USPC .......................................... 714/752, 746, 786
See application file for complete search history.

(56) References Cited

U.S. PATENT DOCUMENTS

| 5,928,331 | A  | * | 7/1999 | Bushmitch | 709/231 |
| 8,412,733 | B1 | * | 4/2013 | Black | 707/769 |
| 8,419,547 | B1 | * | 4/2013 | Radek | 463/42 |
| 2004/0064808 | A1 | * | 4/2004 | Kira | 717/154 |
| 2005/0130694 | A1 | * | 6/2005 | Medvedev et al. | 455/522 |
| 2005/0190762 | A1 | * | 9/2005 | Kobayashi | 370/389 |
| 2006/0077890 | A1 | * | 4/2006 | Suryavanshi et al. | 370/216 |
| 2006/0279437 | A1 | * | 12/2006 | Luby et al. | 341/50 |
| 2007/0124651 | A1 | * | 5/2007 | Champel | 714/776 |
| 2007/0220405 | A1 | * | 9/2007 | Arnold et al. | 714/776 |
| 2009/0016228 | A1 | * | 1/2009 | Ichiki | 370/241 |
| 2010/0125583 | A1 | * | 5/2010 | Casper et al. | 707/745 |
| 2010/0251060 | A1 | * | 9/2010 | Doi et al. | 714/752 |
| 2010/0313093 | A1 | * | 12/2010 | Takaku | 714/746 |

OTHER PUBLICATIONS

U.S. Appl. No. 13/672,367, filed Nov. 8, 2012, Raied N. Mazahreh et al., Xilinx, Inc, San Jose, CA USA.

* cited by examiner

*Primary Examiner* — Albert Decady
*Assistant Examiner* — Osman Alshack
(74) *Attorney, Agent, or Firm* — LeRoy D. Maunu

(57) ABSTRACT

Approaches for recovery of media datagrams are disclosed. Media datagrams, row forward error correction (FEC) datagrams, and column FEC datagrams are received. The media datagrams are logically arranged in rows and columns, each row and column having a corresponding FEC datagram. First, second, and third bitmaps are constructed to respectively indicate availability of media datagrams, row FEC datagrams, and column FEC datagrams. A recoverable media datagram is located in the plurality of media datagrams and is recovered. In response to recovering a datagram using a row FEC datagram, the column having the datagram is checked using the bitmaps to determine if another datagram in the column is recoverable. In response to recovering a datagram using a column FEC datagram, the row having the recovered media datagram is checked to determine if another datagram in the row is recoverable.

20 Claims, 9 Drawing Sheets

RECOVERY OF MEDIA DATAGRAMS

FIELD OF THE INVENTION

One or more embodiments generally relate to recovery of media datagrams.

BACKGROUND

Internet protocol (IP) networks are increasingly being used for delivery of high bit rate video. However, IP networks are subject to network delays, dropped packets, and congestion, all of which pose serious problems for streaming video applications. For example, if a video frame in a data packet contains an error, the entire packet is dropped by the IP network and must be retransmitted. However, in the context of streaming video applications, video frames are required to be presented for viewing in a particular order and at a particular rate to present the illusion of continuous video playback. Often a portion of a video frame included in a dropped data packet cannot be retransmitted before the frame is to be displayed in playback of the streaming video. As a result, the frame will not be available for display when needed.

Some transport protocols for streaming video implement forward error correction (FEC) to recover dropped packets without requiring retransmission. FEC adds metadata redundancy to a data packet by encoding the data packet prior to transmission. The added redundancy is used to detect and recover missing or corrupt portions of the received data. In some protocols, an exclusive-OR (XOR) based FEC algorithm can be implemented in hardware for high-throughput streaming video applications. The XOR-based FEC algorithm can logically arrange data blocks of a data stream into rows and columns of a two dimensional matrix. Depending on the implementation, the data blocks may be data packets, video frames, or other partition of a data stream. For ease of reference, data blocks of the matrix may be referred to as media datagrams herein.

FEC data is computed for each column of the two-dimensional matrix. For ease of reference, the FEC data computed for a column is referred to as a column FEC datagram. To calculate a column FEC datagram, a bitwise XOR of the payload of media datagrams in the column is computed. For example, an XOR is computed for the first two media datagrams in the column. For each following media datagram in the column, a bitwise XOR of the datagram payload and the previous XOR result is computed. The result of the XOR operations is a column FEC datagram that may be used to recover a missing media datagram of the column. If one of the media datagrams is missing, a bitwise XOR of other media datagrams in the column and the column FEC datagram results in the missing media datagram.

The XOR-based FEC algorithm used in the above implementations can recover a missing datagram only if there is no more than one missing datagram in the column. FEC datagrams may also be calculated for each row and column in the two-dimensional matrix. Similar to the description of column FEC datagrams, FEC data is computed for each row of the two-dimensional matrix. For ease of reference, the FEC data computed for a row is referred to as a row FEC datagram. To calculate an FEC datagram for a row, a bitwise XOR of the payload of media datagrams in the row is computed in a similar manner to that described for a column FEC datagram. If one of the media datagrams in the row is missing, a bitwise XOR of other media datagrams in the row and the row FEC datagram results in the missing media datagram.

Even if a row is missing multiple media datagrams, the datagrams may be recoverable in their columns using the column FEC datagrams. For example, recovery of one of the missing media datagrams in the row through column recovery using a column FEC datagram may result in the row having only one missing media datagram, which can then be recovered using the row FEC datagram.

By iteratively searching for recoverable media datagrams (i.e., missing media datagrams that can be recovered via a row or column FEC datagram), a larger number of missing datagrams may be recovered. However, existing methods for locating recoverable media datagrams in a two-dimensional matrix are inefficient and often may not be implemented in hardware. As a result, the methods may not be capable of recovering missing video frames in time for proper display during playback.

One or more embodiments may address one or more of the above issues.

SUMMARY

In one embodiment, a method for recovering media datagrams is provided. A plurality of media datagrams, row forward error correction (FEC) datagrams, and column FEC datagrams are received. The plurality of media datagrams is logically arranged in rows and columns of media datagrams, and each row FEC datagram corresponds to one of the rows and each column FEC datagram corresponds to one of the columns. First, second, and third bitmaps are updated. The first bitmap has bits that indicate availability of corresponding ones of the plurality of media datagrams. The second bitmap has bits that indicate availability of corresponding ones of the row FEC datagrams. The third bitmap has bits that indicate availability of corresponding ones of the column FEC datagrams. A recoverable media datagram is located in the plurality of media datagrams and is recovered. In response to recovering the located media datagram using a row FEC datagram, the column of the located media datagram is checked using one or more of the bitmaps to determine if another datagram in the column is recoverable. In response to correcting the located media datagram using a column FEC datagram, the row of the located media datagram is checked using one or more of the bitmaps to determine if another datagram in the row is recoverable.

In another embodiment, a circuit for recovering media datagrams is provided. The circuit includes a memory buffer for storing a plurality of media datagrams, row forward error correction (FEC) datagrams, and column FEC datagrams. The plurality of media datagrams is logically arranged in rows and columns of media datagrams, and each row FEC datagram corresponds to one of the rows and each column FEC datagram corresponds to one of the columns. A bitmap circuit is configured to maintain first, second, and third bitmaps. Bits of the first bitmap indicate arrival of corresponding ones of the plurality of media datagrams, bits of the second bitmap indicate arrival of corresponding ones of the row FEC datagrams, and bits of the third bitmap indicate arrival of corresponding ones of the column FEC datagrams. An FEC correction circuit is coupled to the memory buffer and the bitmap circuits. The FEC correction circuit is configured to locate and recover a recoverable media datagram of the plurality of media datagrams. In response to recovering the located media datagram using a row FEC datagram, the FEC correction circuit checks the column of the located media datagram using one or more of the bitmaps to determine if another datagram in the column is recoverable. In response to correcting the located media datagram using a column FEC datagram, the FEC correction circuit checks the row of the located media datagram using one or more of the bitmaps to determine if another datagram in the row is recoverable.

In yet another embodiment, an article of manufacture is provided. The article of manufacture includes a non-transitory computer-readable medium having configuration data. The configuration data, when input to a programmable integrated circuit (IC), causes the programmable IC to configure programmable resources of the programmable IC to implement a circuit for recovering media datagrams. A memory buffer, integrated into or coupled to the IC, is configured for storing a plurality of media datagrams, row forward error correction (FEC) datagrams, and column FEC datagrams. The plurality of media datagrams is logically arranged in rows and columns of media datagrams, and each row FEC datagram corresponds to one of the rows and each column FEC datagram corresponds to one of the columns. A bitmap circuit is configured to maintain first, second, and third bitmaps. Bits of the first bitmap indicate arrival of corresponding ones of the plurality of media datagrams, bits of the second bitmap indicate arrival of corresponding ones of the row FEC datagrams, and bits of the third bitmap indicate arrival of corresponding ones of the column FEC datagrams. An FEC correction circuit is coupled to the memory buffer and the bitmap circuits. The FEC correction circuit is configured to locate and recover a recoverable media datagram of the plurality of media datagrams. In response to recovering the located media datagram using a row FEC datagram, the FEC correction circuit checks the column of the located media datagram using one or more of the bitmaps to determine if another datagram in the column is recoverable. In response to correcting the located media datagram using a column FEC datagram, the FEC correction circuit checks the row of the located media datagram using one or more of the bitmaps to determine if another datagram in the row is recoverable.

Other embodiments will be recognized from consideration of the Detailed Description and Claims, which follow.

BRIEF DESCRIPTION OF THE DRAWINGS

Various aspects and advantages of the disclosed embodiments will become apparent upon review of the following detailed description and upon reference to the drawings in which:

FIGS. 2-1 through 2-8 illustrate FEC of media datagrams in a sequence of received datagrams;

FIG. 3 shows a flowchart of a process for correcting media datagrams;

FIG. 4 shows a flowchart of a process for selecting a media datagram for recovery using tables;

FIG. 5 illustrates selection of a media datagram for recovery following recovery of another media datagram using a column FEC datagram;

FIG. 6 illustrates selection of a media datagram for recovery following recovery of another media datagram using a row FEC datagram;

FIG. 7 shows a programmable IC that may be configured in accordance with one or more embodiments;

FIG. 8 shows a computing arrangement that may be configured to implement the processes and functions described herein.

DETAILED DESCRIPTION OF THE DRAWINGS

One or more embodiments provide an efficient method to determine the locations of recoverable media datagrams in a two-dimensional matrix for FEC recovery. The embodiments are directed toward FEC algorithms in which FEC datagrams are transmitted for each row and column of the two-dimensional matrix.

Some methods for locating recoverable media datagrams search the sequence of the two dimensional matrix sequentially for recoverable media datagrams. However, these methods are inefficient in that they check media datagrams that could not have been affected by the previous recovery. Other methods locate a first recoverable media datagram recursively. After recovery of the first datagram, a sequence of recoverable media datagrams is located during back traversal of the recursive algorithm. However, in order to perform the backward traversal of the recursively called instances, complex data structures or linked lists are required to keep track of calling instances and missing datagrams. Such data structures and recursive function calls are often difficult to implement in hardware. While the recursive methods may be implemented in software, software implementations are typically too slow to provide FEC at throughput suitable for high-speed applications. Deficiencies of these methods are discussed with reference to the examples below.

One or more embodiments provide a targeted search method to locate recoverable media datagrams for FEC correction after recovery of a previous media datagram. The targeted search method, allows sequences of recoverable media datagrams, similar to those located by the recursive methods, to be located without performing recursive function calls or maintaining complex data structures. Because recursive function calls are not required for the search, the method may be efficiently implemented in hardware.

Figure 1:
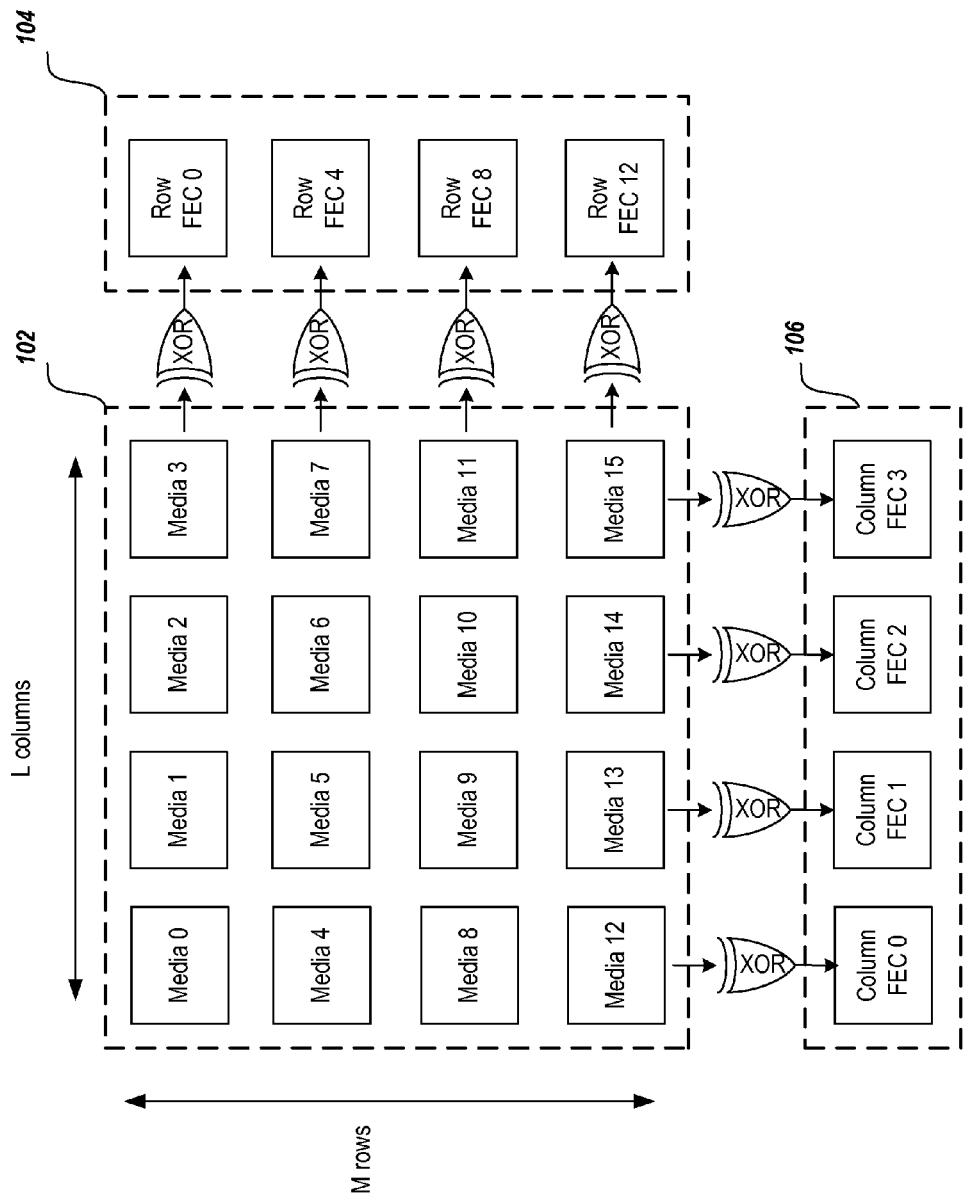
FIG. 1 shows a sequence of media datagrams logically organized into rows and columns of a two dimensional matrix.

FIG. 1 shows a sequence of media datagrams 102 logically organized into rows and columns of a two dimensional matrix. For ease of description, the embodiments and examples are described with reference to a two-dimensional matrix including 16 media datagrams having sequence numbers ranging from 0 to 15. Row FEC datagrams 104 are respectively calculated for the rows in the two dimensional matrix by performing an XOR calculation on the media datagrams 102 of the row, as described above. Each row FEC datagram has a sequence number base equal to the sequence number of the first media datagram in the row. Likewise, column FEC datagrams 106 are calculated respectively for columns in the two dimensional matrix by performing an XOR calculation of the media datagrams 102 of the column. Each column FEC datagram has a sequence number base equal to the sequence number of the first media datagram in the column.

Figures 1, 2:
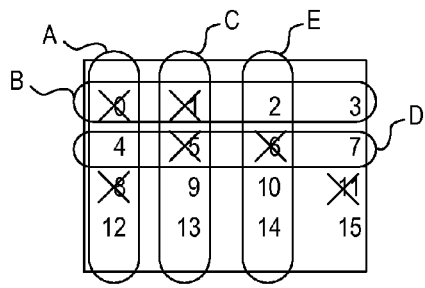
Figure 2:
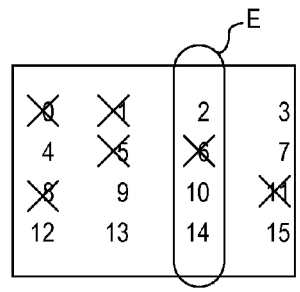

FIG. 2-1 through FIG. 2-8 illustrate FEC of media datagrams in a received sequence of datagrams logically arranged into a two-dimensional matrix. Dropped media datagrams are illustrated as crossed-out with an "X." FIG. 2-1 shows the initial status of a sequence of datagrams. As shown, missing datagram 0 is initially unrecoverable because there is more than one media datagram in both the row and column occupied by datagram 0. However, as illustrated in FIGS. 2-2 through 2-6, datagrams may be recovered in the order 6, 5, 1, 0, 8, 11. As discussed above, it can be difficult to recognize the order in which media datagrams may be recovered. Sequentially searching the media datagrams (e.g., from 0-15) after each datagram recovery to determine if another datagram has become recoverable is inefficient and will not meet throughput constraints required by streaming video applications.

As discussed above, some previous algorithms implement search for recoverable datagrams recursively. Instances (A-E) shown in FIG. 2-1 illustrate function calls implemented by a recursive method. Starting with media datagram 0, instances A-E are recursively called before recoverable media datagram 6 is located. For example, starting with media datagram 0, instance A determines datagram 0 is not recoverable via column FEC datagram, because datagram 8 is missing in the column as well, and recursively calls instance B. Instance B determines the row is not recoverable because media datagram 1 is also missing. A recursive call results in instance C, which determines the datagram 1 is not recoverable because datagram 5 is also missing from column 1, and a recursive call results in instance D. Instance D determines datagram 5 is not recoverable because datagram 6 is also missing in row 1, and a recursive call results in instance E. In instance E, the process determines that datagram 6 can be recovered using a column FEC datagram for column 2 because there are no other missing datagrams in the column.

Figures 2, 3:
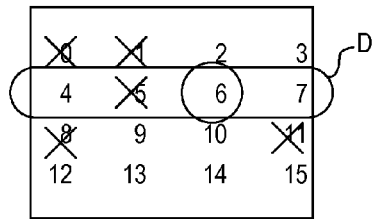
Figures 2, 3, 4:
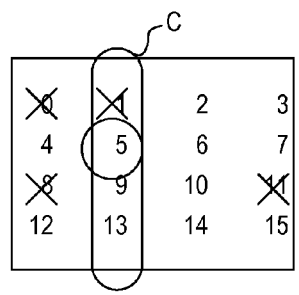

FIGS. 2-2 through 2-6 illustrate the backward traversal of recursive instances A through E. FIG. 2-2 shows the recovery of media datagram 6 by instance E. After missing datagram 6 is recovered, instance E returns processing control to instance D, which recovers media datagram 5, as shown in FIG. 2-3. In each figure, the previously recovered datagram is indicated by a circle. Back traversal continues to instance C, which recovers missing datagram 1 as shown in FIG. 2-4, then to instance B which recovers missing datagram 0 as shown in FIG. 2-5, and then to instance A which recovers datagram 8 as shown in FIG. 2-6.

As mentioned above, in order to perform this backward traversal of the recursively called instances A-E, complex data structures or linked lists are required to keep track of calling instances, which datagrams were found missing in each instance, etc. Such data structures and recursive function calls are difficult to implement in hardware. While the recursive methods are more easily implemented in software, software implementations are typically too slow to provide FEC for many streaming video applications. Software implementations require a large number of memory accesses, which affects the system latency and increases memory requirements. Furthermore, the recursive implementation fails to continue to locate recoverable datagrams after control returns to instance A. Because instance A was the first instance of the process, the data structures constructed by the recursive method fail to identify datagram 8 as recoverable and proceed with recovery of datagrams 8 and 11 as illustrated in FIGS. 2-7 and 2-8. As a result, a sequential search of the matrix may be performed to locate the remaining recoverable datagrams. As discussed above such search is inefficient and limits throughput of the FEC operations.

One or more embodiments provide a targeted search method to locate recoverable media datagrams for FEC correction after recovery of a previous media datagram. In response to recovering a media datagram using a column FEC datagram, the row of the two-dimensional matrix containing the recovered media datagram is checked for a recoverable datagram. Likewise, in response to recovering a media datagram using a row FEC datagram, the column of the two-dimensional matrix containing the recovered media datagram is checked for a recoverable datagram. For example, if media datagram 6 is first identified as recoverable, the method will identify the same sequence of recoverable datagrams as the recursive method (i.e. 6, 5, 1, and 0) as shown in FIGS. 2-2 through 2-6, but does not require recursive function calls or the construction of complex data structures. Since, recursive function calls are not required, the search method may be efficiently implemented in hardware. In addition, the embodiments will continue to identify and recover media datagrams 8 and 11 as shown in FIGS. 2-7 and 2-8 because the embodiments do not require additional recursion to locate recoverable datagrams.

FIG. 3 shows a flowchart of a process for correcting media datagrams in accordance with one or more embodiments. A two-dimensional datagram matrix is scanned at block 304 until a first recoverable media datagram is located at block 306. The search for a first recoverable media datagram may be performed using a number of different methods. For example, in one implementation, a recursive approach may be employed to locate the first recoverable media datagram as described above. However, unlike the recursive method described above, the backward traversal of the recursion is not used to locate additional recoverable media datagrams. Therefore, a recursive function used to locate the first recoverable media datagram at blocks 304 and 306 can exit once the datagram is located, back-traversal is not needed. Thus, the search can be implemented without maintaining data structures and a call stack of function calls.

In another implementation, the two dimensional matrix may be searched sequentially for a first recoverable media datagram. In the sequential search, a sequence of recoverable media datagrams may be located that is similar to the sequence of recoverable datagrams located in the recursive back traversal described above. In yet some other implementations, rows and columns of the two dimensional matrix may be checked for recoverable media datagrams in response to receiving a corresponding row/column FEC datagram.

The first-located media datagram is recovered at block 308. If the recovery was performed using a row FEC datagram, decision block 310 directs the process to block 312 to scan the column of the matrix that includes the recovered media datagram for a recoverable media datagram. Otherwise, the recovery was performed using a column FEC datagram and the row of the matrix that includes the recovered media datagram is scanned for a recoverable media datagram at block 314. The processes of blocks 308, 310, 312, and 314 are repeated to identify and recover sequences of recoverable media datagrams in an order similar to the order followed by the recursive method.

If no recoverable media datagram is located by block 312 or 314 (decision block 316), there are no more media datagrams that have been made recoverable from the previous recovered datagrams. However, other media datagrams may still be missing from the two dimensional matrix. In response to failing to locate recoverable media datagrams at decision block 316, the scan for recoverable media datagrams performed previously at block 304 is continued to check for other missing datagrams. If no further missing datagram is located, the scan will continue until the entire two-dimensional matrix has been checked for recoverable media datagrams at decision block 318.

The above selection process provides a targeted search for recoverable media datagrams similar to recursive methods without the costs associated with recursive algorithms. This targeted search, based on the location of the previously recovered media datagram, only checks for missing datagrams that could have been made recoverable as a result of the previously recovered datagram. Because the targeted search may be implemented without recursion, memory accesses and requirements necessary to maintain data structures and the call stack are reduced. As a result, processing time can be improved. In this manner, time necessary to search for recoverable datagrams is reduced and overall recovery time is improved.

It is understood that the recovery of a media datagram may not be possible if the needed row FEC datagram or the column FEC datagram was lost or transmitted in error. If recovery cannot proceed due to unavailability of an FEC datagram (e.g., a row FEC datagram) the missing datagram is considered to be unrecoverable and may be skipped. In some implementations, the process may continue to locate and recover recoverable media datagrams, which may allow recovery of the unrecoverable data via the column FEC datagram. For ease of explanation, the embodiments and examples are primarily described with the assumption that no row or column FEC datagrams are missing.

In one or more embodiments, one or more tables may be constructed to track availability of media and FEC datagrams. The tables may be constructed as datagrams are received and may thereafter be used to facilitate efficient searching for recoverable media datagrams. For example, the tables may be constructed for efficient searches for missing media datagrams and available FEC datagrams. FIG. 4 shows a flowchart of a process for selecting a media datagram for recovery using tables that indicate the availability of media datagrams, row FEC datagrams, and column FEC datagrams in accordance with one or more embodiments. For ease of explanation, the process shown in FIG. 4 is described with reference to the examples illustrated in FIGS. 5 and 6.

A first media datagram is recovered at block 402. If the media datagram recovered at block 402 was recovered using a column FEC datagram, decision block 404 directs the process to block 410. At block 410, the process scans the row FEC datagram table, which indicates availability of row FEC datagrams, to determine the first media datagram in the row containing the recovered media datagram. As shown in FIGS. 1 and 2-1 through 2-8, the logical matrix includes sequence numbers that may be used to index media datagrams of the sequence in the tables as discussed below. The sequence number of the first media datagram in the row is used as a base index for searching the media datagram table. Using the determined base index, entries of the media datagram table corresponding to datagrams in the row are checked at block 412 to determine if the row contains a recoverable media datagram.

Figures 2, 3, 4, 5:
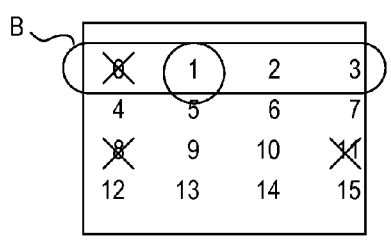

FIG. 5 illustrates selection of a media datagram for recovery using the row FEC datagram table and media datagram table described with reference to blocks 410 and 412 of FIG. 4. The table 502 and table 504 respectively indicate availability of row FEC datagrams and media datagrams according to the sequence number of the media datagrams in the two-dimensional matrix. In this example, availability of datagrams corresponds to the example shown in FIG. 2-3, in which media datagram 6 was previously recovered. As shown in FIG. 5, the sequence number of the recovered media datagram is used as a starting index for a search of the row FEC datagram table. The base index (corresponding to the sequence number of the first media datagram of a row) into the media datagram table may be determined at block 410 by checking entries in the row FEC datagram table at indexes preceding the recovered datagram for availability of a row FEC datagram. Working backward from the sequence number index of the recovered media datagram, entries of table 502 are checked until an entry indicates an available row FEC datagram. In the worst case, L entries in the table will need to be checked before an available row media datagram is located (where L is equal to the number of media datagrams in each row). Using the example shown in FIG. 2-3, sequence number 4 is determined to be the base index of the row because table 502 indicates that a row FEC datagram is available at index 4 (i.e., having sequence number base equal to 4).

The row may be scanned at block 412 for recoverable media datagrams by checking L sequential entries starting at the base row index in the media datagram table 504. If only one of the scanned entries of table 504 indicates that a media datagram is not available, at decision block 414, the media datagram at that index is recoverable and is selected for recovery at block 416. In this example, only media datagram 5 is unavailable in the row, and thus, is selected for recovery.

If the media datagram recovered at block 402 was recovered using a row FEC datagram, decision block 404 directs the process to block 406. At block 406, the process scans the column FEC datagram table, starting at the sequence number index of the previous recovered datagram, for an entry corresponding to a column FEC media datagram, to determine a base index of the columns (e.g., the sequence number of the first datagram in the column). Using the determined base index, the media datagram table is checked at block 408 to determine if the column contains a recoverable media datagram.

Figures 2, 3, 4, 5, 6:
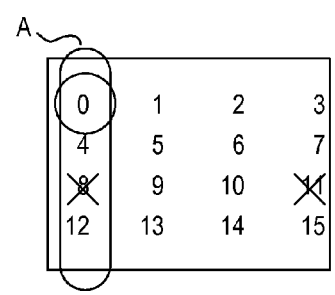

FIG. 6 illustrates selection of a media datagram for recovery using the column FEC datagram table 602 and media datagram table 604. The table 602 and table 604 respectively indicate availability of column FEC datagrams and media datagrams according to index of the sequence of media datagrams in the two-dimensional matrix. In this example, availability of datagrams corresponds to the example shown in FIG. 2-4, in which media datagram 5 was previously recovered. Media datagram table 604 is a version of table 504 updated to reflect the recovery of datagram 5. The sequence number of the recovered media datagram (5) is used as a starting index for searching the column FEC datagram table 602. The base index is determined at block 406 by checking entries of the column FEC datagram table for availability of a column FEC datagram. Working backward from the starting index of the previous recovered media datagram in table 602 (media datagram 5), every $L^{th}$ preceeding entry of table 602 is checked until an entry indicates an available column FEC datagram. In the worst case, M entries in the table will need to be checked before an available column media datagram is located (where M is equal to the number of datagrams in each column). Using the example shown in FIG. 2-4, sequence number 1 is determined to be the base index because table 602 indicates that a column FEC datagram is available with sequence number base equals to 1.

The entries in the media datagram table corresponding to column 1 are scanned at block 408 for recoverable media datagrams. Starting at the determined base index of column 1, every $L^{th}$ entry is checked up to M entries. If only one of the scanned entries of table 604 indicates that a media datagram is not available, the media datagram at that index is recoverable and may be selected for recovery at block 416. In this example, only media datagram 1 is unavailable in the column, and thus, is selected next for recovery at block 416.

It is recognized that the embodiments may be applicable to other FEC algorithms that logically arrange datagrams into rows and columns of a two-dimensional matrix for FEC computation. Furthermore, it is understood that one or more embodiments may implement further redundancy in addition to the FEC algorithm to provide continuous data flow in cases where the implemented FEC algorithms cannot provide the necessary protection.

Figures 2, 3, 4, 5, 6, 7:
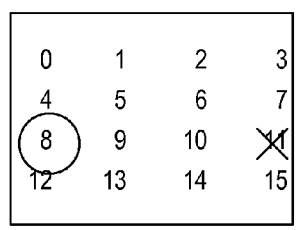

FIG. 7 shows a circuit for recovering media datagrams in accordance with one or more embodiments. The circuit 702 includes a memory buffer 704 that is configured and arranged to store a plurality of media datagrams, row FEC datagrams, and column FEC datagrams that are received at an input of the circuit 702. The media datagrams are logically arranged in rows and columns of media datagrams. Each row FEC datagram corresponds to one of the rows, and each column FEC datagram corresponds to one of the columns. A bitmap circuit 706 is configured to maintain the media datagram, row FEC datagram, and column FEC datagram tables discussed above. An FEC circuit 708 is coupled to the memory buffer 704 and to the bitmap circuit 706. In this example, the memory buffer 704 is integrated in the same circuit as the FEC circuit 708 and bitmap circuit. However, it is understood that the memory buffer 704 may be implemented using external memory coupled to the datagram recovery circuit 702 as well. The FEC circuit 708 is configured and arranged to locate a recoverable media datagram of the plurality of media datagrams and recover the located recoverable media datagram.

As described above, in response to recovering a media datagram using a row FEC datagram, the FEC circuit checks the column of the recovered media datagram using the bitmaps of the bitmap circuit 706 to determine if another datagram in the column is recoverable. Likewise, in response to recovering a media datagram using a column FEC datagram, the FEC circuit 708 is configured and arranged to check the row of the recovered media datagram using the bitmaps of the bitmap circuit 706 to determine if another datagram in the row is recoverable.

Figures 2, 3, 4, 5, 6, 7, 8:
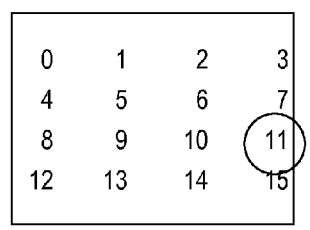
Figure 3:
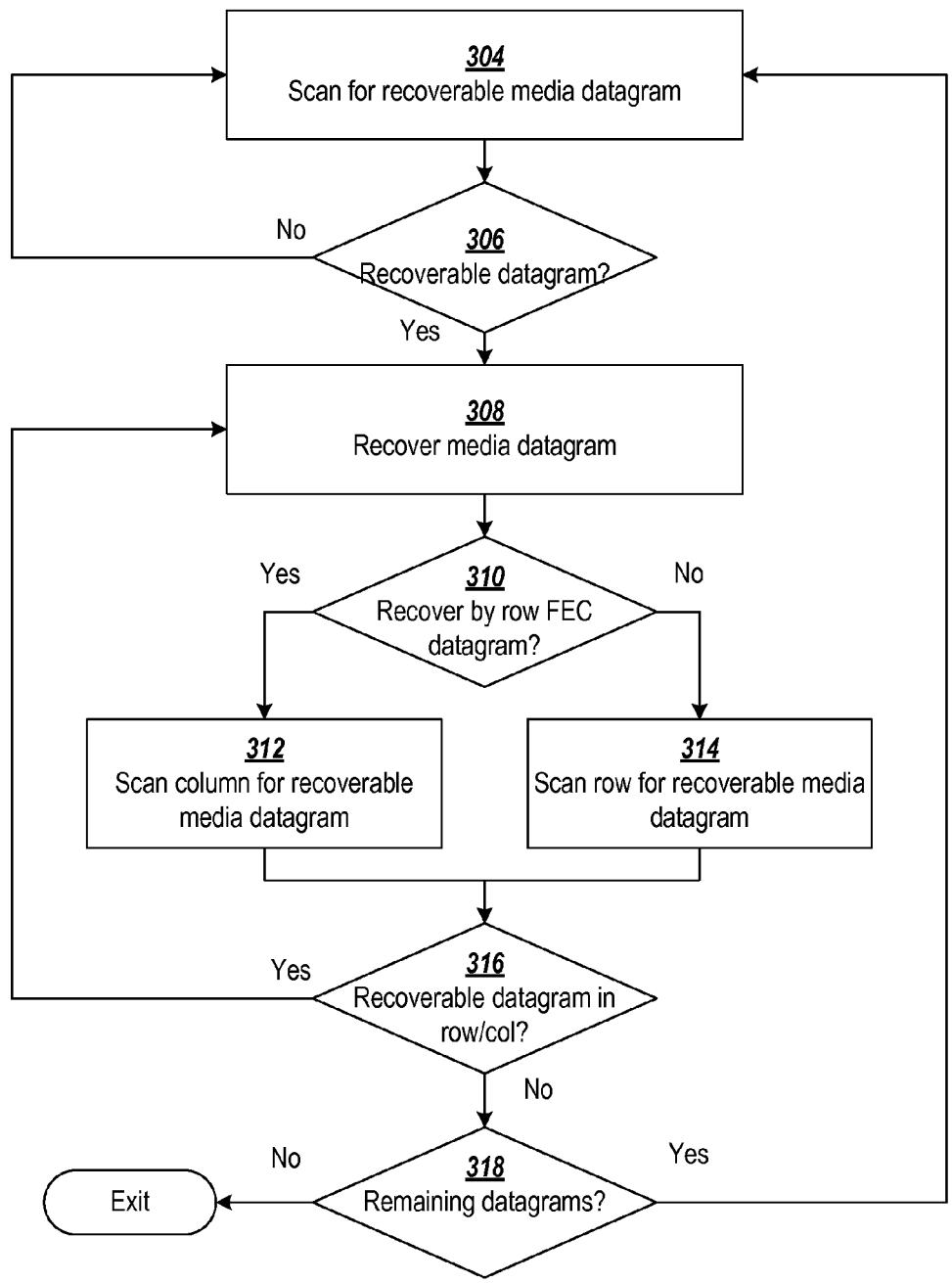
Figure 4:
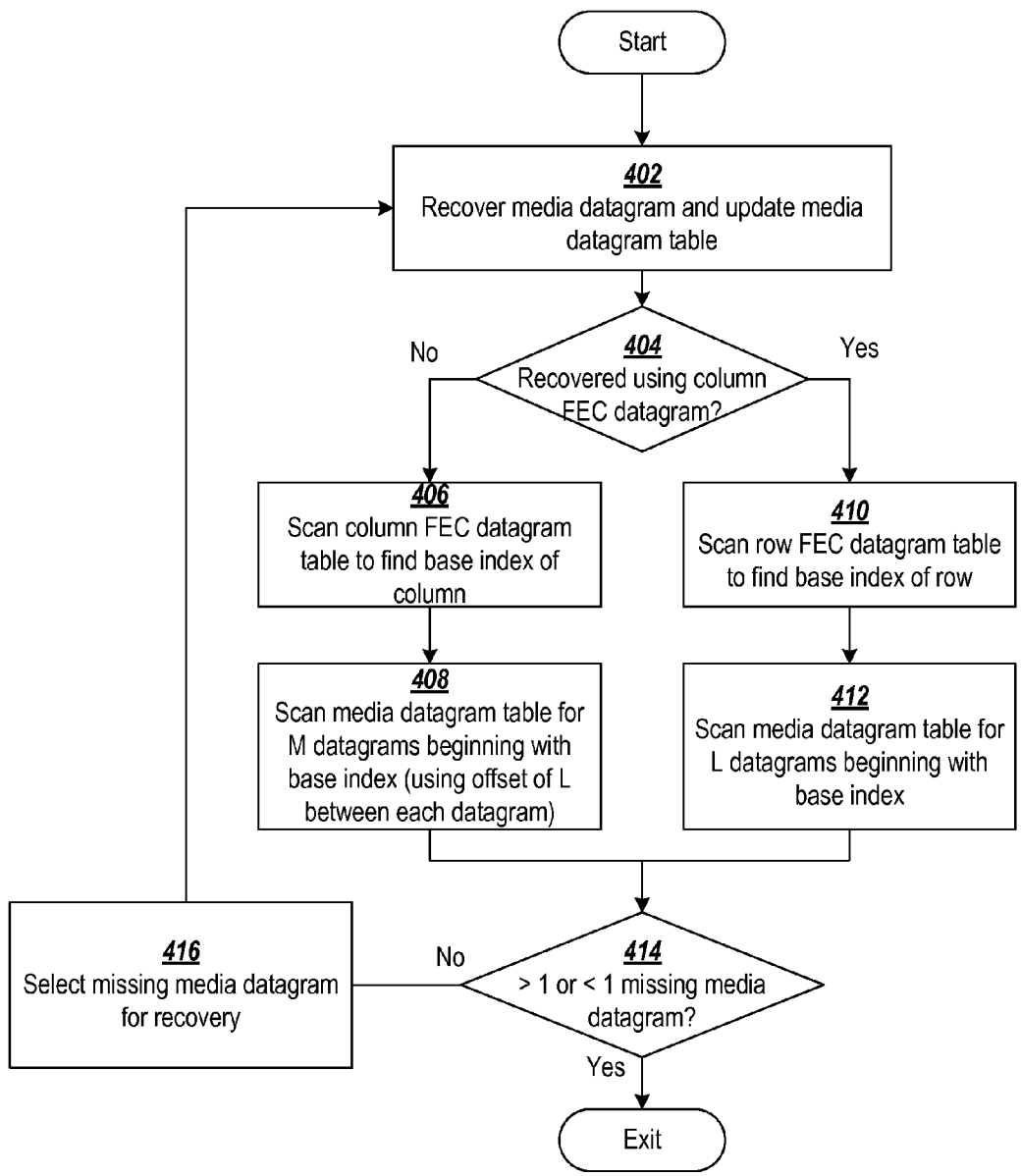
Figure 5:
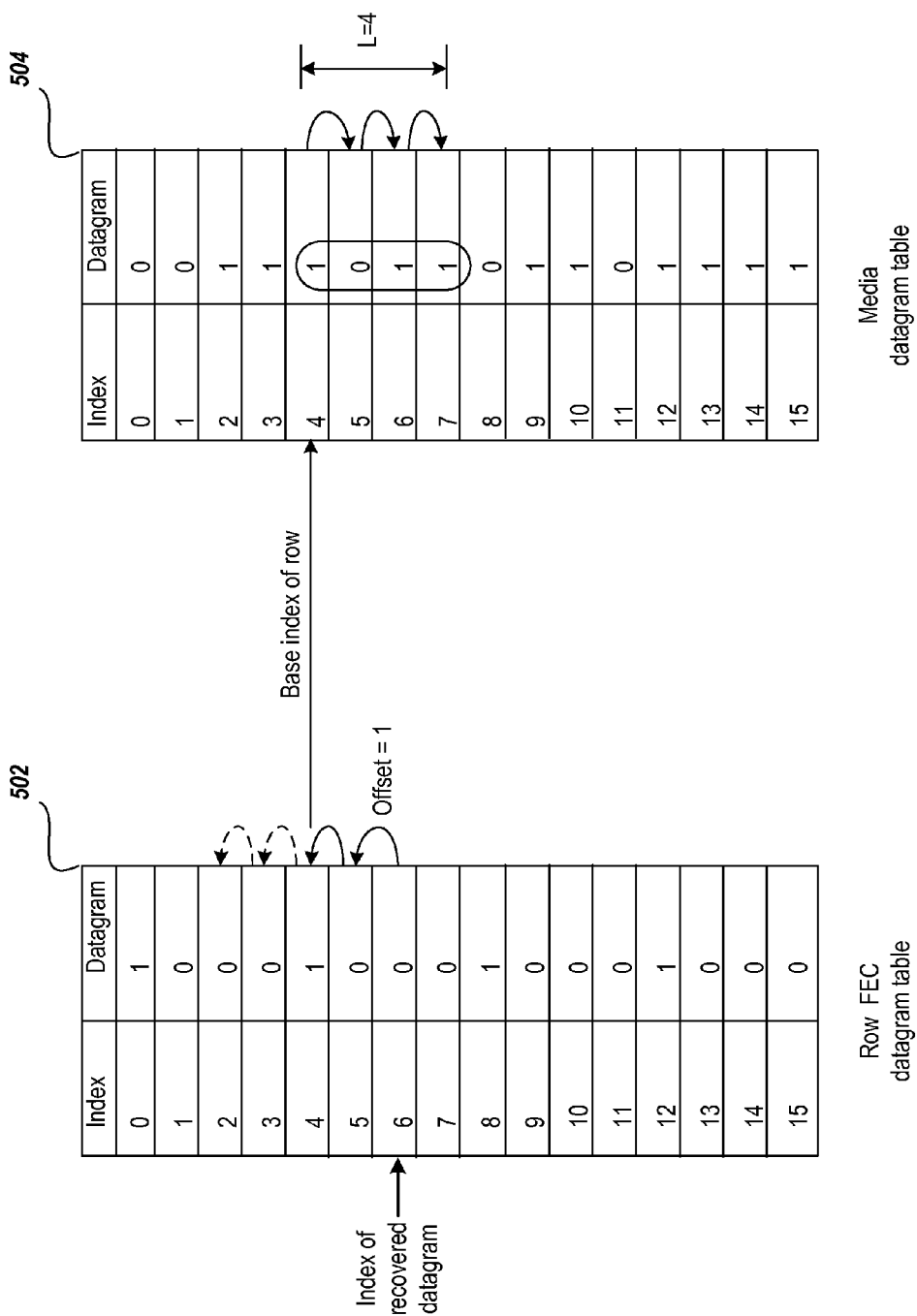
Figure 6:
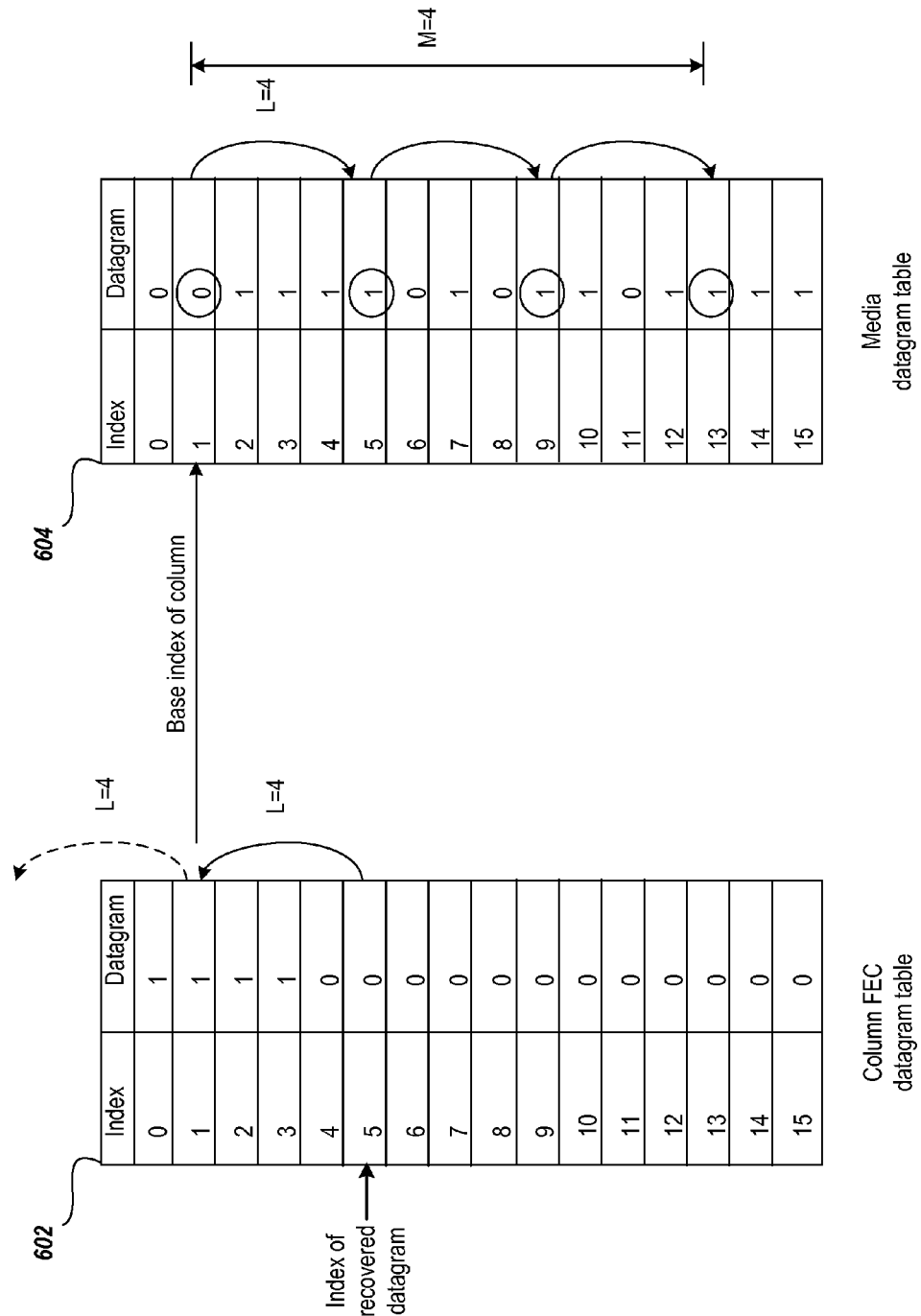
Figure 7:
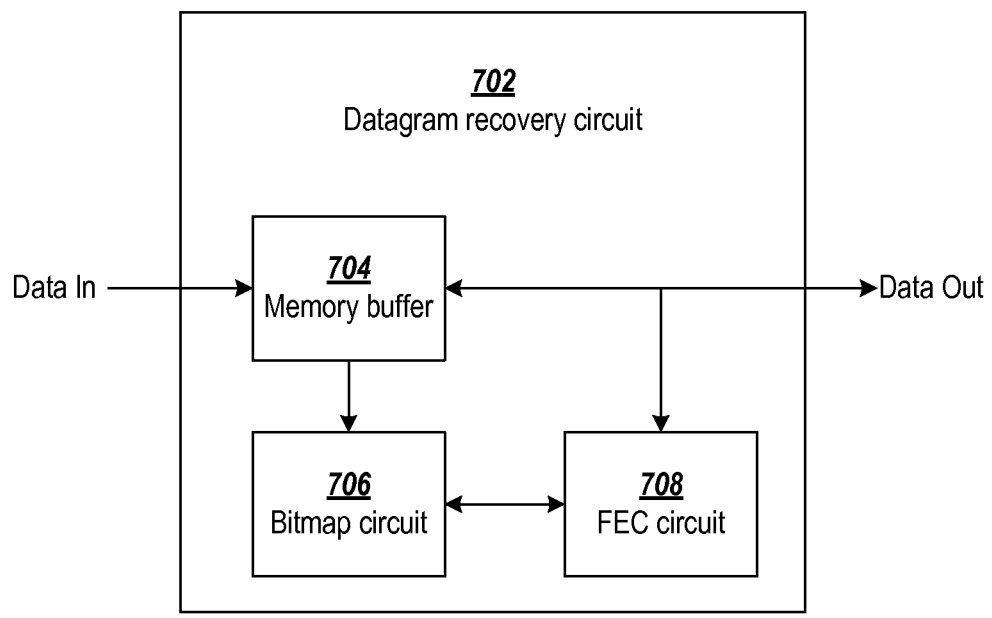
Figure 8:
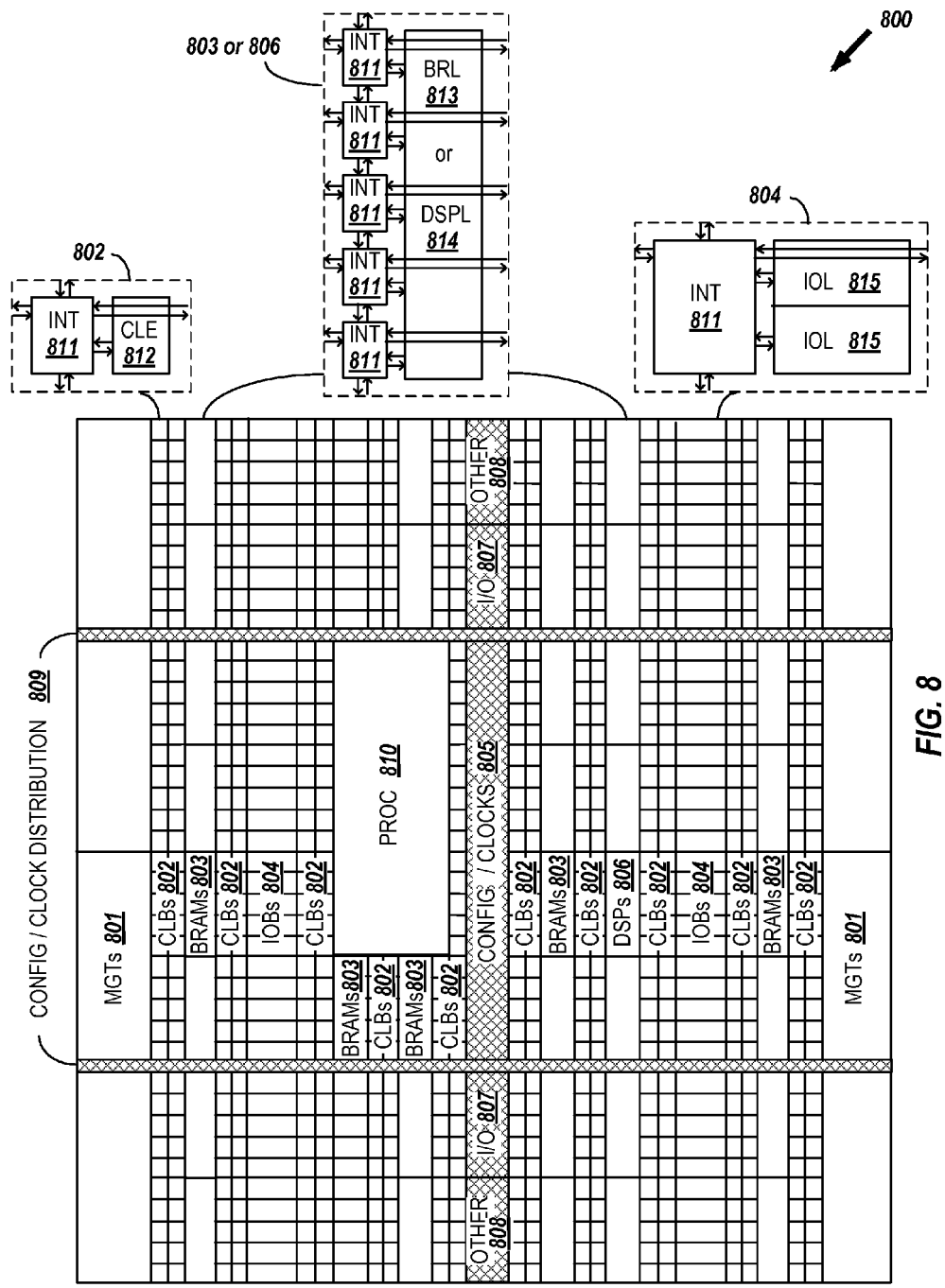

FIG. 8 is a block diagram of an example programmable logic integrated circuit that may be used in implementing FEC correction circuitry in accordance with one or more embodiments. FEC circuitry configured to perform the methods or one or more embodiments may be implemented on the programmable logic (e.g., programmable resources) and interconnect resources of a programmable integrated circuit.

Programmable ICs can include several different types of programmable logic blocks in the array. For example, FIG. 8 illustrates a type of programmable IC known as a field programmable gate array (FPGA) (800) that includes a large number of different programmable tiles including multi-gigabit transceivers (MGTs 801), configurable logic blocks (CLBs 802), random access memory blocks (BRAMs 803), input/output blocks (IOBs 804), configuration and clocking logic (CONFIG/CLOCKS 805), digital signal processing blocks (DSPs 806), specialized input/output blocks (I/O 807), for example, e.g., clock ports, and other programmable logic 808 such as digital clock managers, analog-to-digital converters, system monitoring logic, and so forth. Some FPGAs also include dedicated processor blocks (PROC 810).

In some FPGAs, each programmable tile includes a programmable interconnect element (INT 811) having standardized connections to and from a corresponding interconnect element in each adjacent tile. Therefore, the programmable interconnect elements taken together implement the programmable interconnect structure for the illustrated FPGA. The programmable interconnect element INT 811 also includes the connections to and from the programmable logic element within the same tile, as shown by the examples included at the top of FIG. 8.

For example, a CLB 802 can include a configurable logic element CLE 812 that can be programmed to implement user logic plus a single programmable interconnect element INT 811. A BRAM 803 can include a BRAM logic element (BRL 813) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 806 can include a DSP logic element (DSPL 814) in addition to an appropriate number of programmable interconnect elements. An IOB 804 can include, for example, two instances of an input/output logic element (IOL 815) in addition to one instance of the programmable interconnect element INT 811. As will be clear to those of skill in the art, the actual I/O pads connected, for example, to the I/O logic element 815 are manufactured using metal layered above the various illustrated logic blocks, and typically are not confined to the area of the input/output logic element 815.

In the pictured embodiment, a horizontal area near the center of the die (shown shaded in FIG. 8) is used for configuration, clock, and other control logic. Vertical areas 809 extending from this horizontal area are used to distribute the clocks and configuration signals across the FPGA.

Some FPGAs utilizing the architecture illustrated in FIG. 8 include additional logic blocks that disrupt the regular columnar structure making up a large part of the FPGA. The additional logic blocks can be programmable blocks and/or dedicated logic. For example, the processor block PROC 810 shown in FIG. 8 spans several columns of CLBs and BRAMs.

Note that FIG. 8 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 8 are purely exemplary. For example, in an actual FPGA more than one adjacent column of CLBs is typically included wherever the CLBs appear, to facilitate the efficient implementation of user logic.

Figure 9:
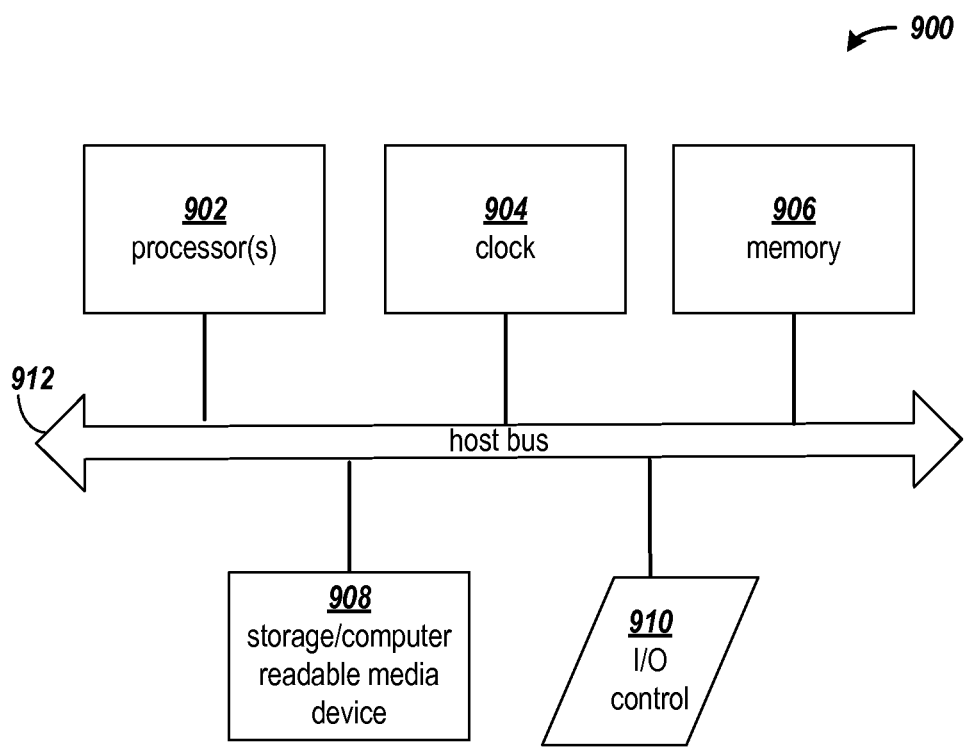
FIG. 9 shows a block diagram of an example computing arrangement that may be configured to implement the processes and functions described herein.

FIG. 9 shows a block diagram of an example computing arrangement that may be configured to implement the processes and functions described herein. It will be appreciated that alternative computing arrangements, including one or more processors and a memory arrangement configured with program code, would be suitable for hosting the processes and data structures and implementing the algorithms of the different embodiments. The computer code, comprising the processes of one or more embodiments encoded in a processor executable format, may be stored and provided via a variety of computer-readable storage media or delivery channels such as magnetic or optical disks or tapes, electronic storage devices, or as application services over a network.

Processor computing arrangement 900 includes one or more processors 902, a clock signal generator 904, a memory unit 906, a storage unit 908, and an input/output control unit 910 coupled to a host bus 912. The arrangement 900 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor 902 may be one or more general purpose processors, or a combination of one or more general purpose processors and suitable co-processors, or one or more specialized processors (e.g., RISC, CISC, pipelined, etc.).

The memory arrangement 906 typically includes multiple levels of cache memory, and a main memory. The storage arrangement 908 may include local and/or remote persistent storage such as provided by magnetic disks (not shown), flash, EPROM, or other non-volatile data storage. The storage unit may be read or read/write capable. Further, the memory 906 and storage 908 may be combined in a single arrangement.

The processor arrangement 902 executes the software in storage 908 and/or memory 906 arrangements, reads data from and stores data to the storage 908 and/or memory 906 arrangements, and communicates with external devices through the input/output control arrangement 910. These functions are synchronized by the clock signal generator 904. The resource of the computing arrangement may be managed by either an operating system (not shown), or a hardware control unit (not shown).

The embodiments are thought to be applicable to a variety of systems for FEC. Other aspects and embodiments will be apparent to those skilled in the art from consideration of the specification. The embodiments may be implemented as one or more processors configured to execute software, as an application specific integrated circuit (ASIC), or as a logic on a programmable logic device. It is intended that the specification and illustrated embodiments be considered as examples only, with a true scope of the invention being indicated by the following claims.

The invention claimed is:

1. A method for recovering a plurality of media datagrams, comprising:
   receiving, by a datagram recovery circuit, the plurality of media datagrams, row forward error correction (FEC) datagrams, and column FEC datagrams, wherein the plurality of media datagrams is logically arranged in rows and columns of media datagrams, and each row FEC datagram corresponds to one of the rows of the media datagrams and each column FEC datagram corresponds to one of the columns of the media datagrams;
   updating first, second, and third bitmaps, wherein the first bitmap has a respective bit for each media datagram and the respective bit indicates availability of the media datagram, the second bitmap has a respective bit for each row FEC datagram and the respective bit indicates availability of the row FEC datagram, and the third bitmap has a respective bit for each column FEC datagram and the respective bit indicates availability of the column FEC datagram;
   locating a recoverable media datagram in the plurality of media datagrams and recovering the located recoverable media datagram;
   in response to recovering the located media datagram using a row FEC datagram, checking the column of the located media datagram using one or more of the bitmaps to determine if another datagram in the column is recoverable; and
   in response to recovering the located media datagram using a column FEC datagram, checking the row of the located media datagram using one or more of the bitmaps to determine if another datagram in the row is recoverable.

2. The method of claim 1, wherein the checking the column of the located media datagram includes using the first bitmap to determine whether more than one media datagram in the column is unavailable.

3. The method of claim 1, wherein the checking the column of the located media datagram includes:
   determining for the column, a base index into the first bitmap using the third bitmap; and
   scanning the first bitmap beginning at the base index to determine a number of unavailable media datagrams in the column.

4. The method of claim 3, wherein the scanning the first bitmap includes:

checking M entries of the first bitmap beginning at the base index and every following $L^{th}$ entry, where L is equal to a number of columns and M is equal to a number of rows in the logical arrangement of the plurality of media datagrams.

5. The method of claim 1, wherein the checking the row of the located media datagram includes:
   determining for the row, a base index into the first bitmap using the second bitmap; and
   scanning the first bitmap beginning at the base index to determine a number of unavailable media datagrams in the row.

6. The method of claim 5, wherein the scanning the first bitmap includes:
   checking L consecutive entries of the first bitmap starting at the base index, where L is equal to the number of columns in the logical arrangement of the plurality of media datagrams.

7. The method of claim 1, wherein:
   each row FEC is equal to an XOR of a respective one of the rows of the logical arrangement of the plurality of media datagrams; and
   each column FEC is equal to an XOR of a respective one of the columns of the logical arrangement of the plurality of media datagrams.

8. The method of claim 1, wherein the recoverable media datagram in the plurality of media datagrams is located using a recursive process.

9. A circuit for recovering media datagrams, comprising:
   a memory buffer for storing a plurality of media datagrams, row forward error correction (FEC) datagrams, and column FEC datagrams, wherein the plurality of media datagrams is logically arranged in rows and columns of media datagrams, and each row FEC datagram corresponds to one of the rows of the media datagrams and each column FEC datagram corresponds to one of the columns of the media datagrams;
   a bitmap circuit configured to maintain first, second, and third bitmaps, wherein the first bitmap has a respective bit for each media datagram in the rows and columns and the respective bit indicates arrival of the media datagram, the second bitmap has a respective bit for each row FEC datagram and the respective bit indicates arrival of the row FEC datagram, and the third bitmap has a respective bit for each column FEC datagram and the respective bit indicates arrival of the column FEC datagram; and
   an FEC correction circuit coupled to the memory buffer and the bitmap circuits, the FEC correction circuit configured to:
      locate a recoverable media datagram of the plurality of media datagrams and recover the located recoverable media datagram;
      in response to recovering the located media datagram using a row FEC datagram, checking the column of the located media datagram using one or more of the bitmaps to determine if another datagram in the column is recoverable; and
      in response to recovering the located media datagram using a column FEC datagram, checking the row of the located media datagram using one or more of the bitmaps to determine if another datagram in the row is recoverable.

10. The circuit of claim 9, wherein the checking the column of the located media datagram includes using the first bitmap to determine whether more than one media datagram in the column is unavailable.

11. The circuit of claim 9, wherein the checking the column of the located media datagram includes:
  determining for the column, a base index into the first bitmap using the third bitmap; and
  scanning the first bitmap beginning at the base index to determine a number of unavailable media datagrams in the column.

12. The circuit of claim 11, wherein the scanning the first bitmap includes:
  checking M entries of the first bitmap beginning at the base index and every following $L^{th}$ entry, where L is equal to a number of columns and M is equal to a number of rows in the logical arrangement of the plurality of media datagrams.

13. The circuit of claim 9, wherein the checking the row of the located media datagram includes:
  determining for the row, a base index into the first bitmap using the second bitmap; and
  scanning the first bitmap beginning at the base index to determine a number of unavailable media datagrams in the row.

14. The circuit of claim 13, wherein the scanning the first bitmap includes:
  checking L consecutive entries of the first bitmap starting at the base index, where L is equal to the number of columns in the logical arrangement of the plurality of media datagrams.

15. The circuit of claim 9, wherein:
  each row FEC is equal to an XOR of a respective one of the rows of the plurality of media datagrams; and
  each column FEC is equal to an XOR of a respective one of the columns of the plurality of media datagrams.

16. The circuit of claim 9, wherein the recoverable media datagram in the plurality of media datagrams is located using a recursive process.

17. An article of manufacture, comprising:
  a non-transitory computer-readable medium having configuration data that when input to a programmable integrated circuit (IC) causes the programmable IC to configure programmable resources of the programmable IC to implement a circuit for recovering media datagrams from a plurality of media datagrams, row forward error correction (FEC) datagrams, and column FEC datagrams, the plurality of media datagrams logically arranged in rows and columns of media datagrams, each row FEC datagram corresponding to one of the rows of the media datagrams and each column FEC datagram corresponding to one of the columns of the media datagrams, the circuit including:
  a bitmap circuit configured to maintain first, second, and third bitmaps, wherein the first bitmap has a respective bit for each media datagram in the rows and columns and the respective bit indicates arrival of the media datagram, the second bitmap has a respective bit for each row FEC datagram and the respective bit indicates arrival of the row FEC datagram, and the third bitmap has a respective bit for each column FEC datagram and the respective bit indicate arrival of corresponding ones of the column FEC datagrams; and
  an FEC correction circuit coupled to the bitmap circuits, the FEC correction circuit configured to:
    locate a recoverable media datagram of the plurality of media datagrams and recover the located recoverable media datagram;
    in response to recovering the located media datagram using a row FEC datagram, check the column of the located media datagram using one or more of the bitmaps to determine if another datagram in the column is recoverable; and
    in response to recovering the located media datagram using a column FEC datagram, check the row of the located media datagram using one or more of the bitmaps to determine if another datagram in the row is recoverable.

18. The article of manufacture of claim 17, wherein the FEC correction circuit is configured to check the column of the located media datagram by performing operations including:
  determining for the column, a base index into the first bitmap using the third bitmap; and
  scanning the first bitmap beginning at the base index to determine a number of unavailable media datagrams in the column.

19. The article of manufacture of claim 18, wherein the scanning the first bitmap includes:
  checking M entries of the first bitmap beginning at the base index and every following $L^{th}$ entry, where L is equal to a number of columns and M is equal to a number of rows in the logical arrangement of the plurality of media datagrams.

20. The article of manufacture of claim 17, wherein the FEC correction circuit is configured to check the row of the located media datagram by performing operations including:
  determining for the row, a base index into the first bitmap using the second bitmap; and
  checking L consecutive entries of the first bitmap starting at the base index to determine a number of unavailable media datagrams in the row, where L is equal to the number of columns in the logical arrangement of the plurality of media datagrams.

* * * * *